United States Patent
Ebihara et al.

(10) Patent No.: US 10,854,762 B2
(45) Date of Patent: Dec. 1, 2020

(54) SEMICONDUCTOR DEVICE

(71) Applicant: Mitsubishi Electric Corporation, Chiyoda-ku (JP)

(72) Inventors: Kohei Ebihara, Tokyo (JP); Masayuki Furuhashi, Tokyo (JP); Takanori Tanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 109 days.

(21) Appl. No.: 16/090,885

(22) PCT Filed: Mar. 22, 2017

(86) PCT No.: PCT/JP2017/011344
§ 371 (c)(1),
(2) Date: Oct. 3, 2018

(87) PCT Pub. No.: WO2017/183375
PCT Pub. Date: Oct. 26, 2017

(65) Prior Publication Data
US 2019/0074386 A1 Mar. 7, 2019

(30) Foreign Application Priority Data
Apr. 21, 2016 (JP) .................. 2016-085004

(51) Int. Cl.
H01L 29/872 (2006.01)
H01L 29/47 (2006.01)
(Continued)

(52) U.S. Cl.
CPC ............ H01L 29/872 (2013.01); H01L 21/28 (2013.01); H01L 29/06 (2013.01);
(Continued)

(58) Field of Classification Search
CPC ....... H01L 29/872; H01L 29/12; H01L 29/78; H01L 21/28; H01L 29/06; H01L 29/0634;
(Continued)

(56) References Cited

U.S. PATENT DOCUMENTS 8,395,230 B2 * 3/2013 Hozumi ............. H01L 29/0615
257/493
8,421,152 B2 * 4/2013 Sasaki ................. H01L 29/0634
257/339

(Continued)

FOREIGN PATENT DOCUMENTS

| JP | 2001-298190 A | 10/2001 |
| JP | 2002-280555 A | 9/2002 |

(Continued)

OTHER PUBLICATIONS

International Search Report dated May 16, 2017 for PCT Application No. PCT/JP2017/011344 filed on Mar. 22, 2017.

(Continued)

Primary Examiner — Stephen W Smoot
Assistant Examiner — Vicki B. Booker
(74) Attorney, Agent, or Firm — Xsensus LLP

(57) ABSTRACT

A semiconductor device includes an n-type drift layer formed on a semiconductor substrate having an off-angle, plurality of p-type pillar regions formed in the drift layer, and a surface electrode formed on the drift layer including the plurality of p-type pillar regions. A plurality of withstand voltage holding structures which are p-type semiconductor regions are formed in a surface layer of the drift layer including the plurality of p-type pillar regions to surround an active region. Each of the plurality of p-type pillar regions has a linear shape extending in a direction of the off-angle of the semiconductor substrate. Each of the plurality of withstand voltage holding structures has a frame-like shape (Continued)

including sides extending in parallel with the plurality of p-type pillar regions and sides perpendicular to the plurality of p-type pillar regions in a planar view.

16 Claims, 10 Drawing Sheets

(51) Int. Cl.
    *H01L 29/12*     (2006.01)
    *H01L 29/78*     (2006.01)
    *H01L 21/28*     (2006.01)
    *H01L 29/06*     (2006.01)
    *H01L 29/16*     (2006.01)
    *H01L 29/417*     (2006.01)

(52) U.S. Cl.
    CPC ...... *H01L 29/0634* (2013.01); *H01L 29/0696* (2013.01); *H01L 29/12* (2013.01); *H01L 29/1608* (2013.01); *H01L 29/41741* (2013.01); *H01L 29/47* (2013.01); *H01L 29/78* (2013.01); *H01L 29/7811* (2013.01)

(58) Field of Classification Search
    CPC .............. H01L 29/0696; H01L 29/1608; H01L 29/41741; H01L 29/7811; H01L 29/47
    See application file for complete search history.

(56) References Cited

U.S. PATENT DOCUMENTS

| | | |
|---|---|---|
| 2001/0028083 A1 | 10/2001 | Onishi et al. |
| 2002/0171093 A1 | 11/2002 | Onishi et al. |
| 2005/0184336 A1 | 8/2005 | Takahashi et al. |
| 2006/0216896 A1 | 9/2006 | Saito et al. |
| 2007/0272979 A1 | 11/2007 | Saito et al. |
| 2010/0200936 A1 | 8/2010 | Saito et al. |
| 2012/0126315 A1 | 5/2012 | Onishi et al. |

FOREIGN PATENT DOCUMENTS

| | | |
|---|---|---|
| JP | 2005-260199 A | 9/2005 |
| JP | 2006-269720 A | 10/2006 |
| JP | 2008-4643 A | 1/2008 |
| JP | 2008-311261 A | 12/2008 |
| JP | 2012-533167 A | 12/2012 |
| WO | 2011/013379 A1 | 2/2011 |
| WO | 2017/187856 A1 | 11/2017 |

OTHER PUBLICATIONS

Notification of Reasons for Refusal issued for corresponding Japanese Patent Application No. 2017-536374 dated Sep. 29, 2017.

* cited by examiner

F I G . 1 5
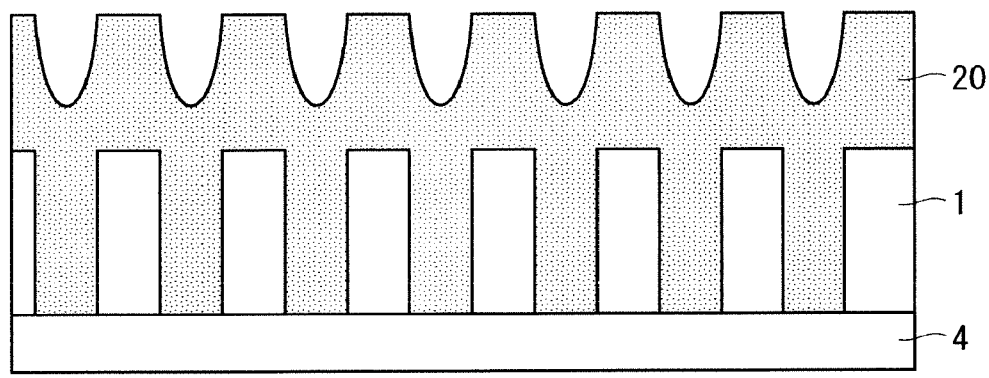
F I G . 1 6
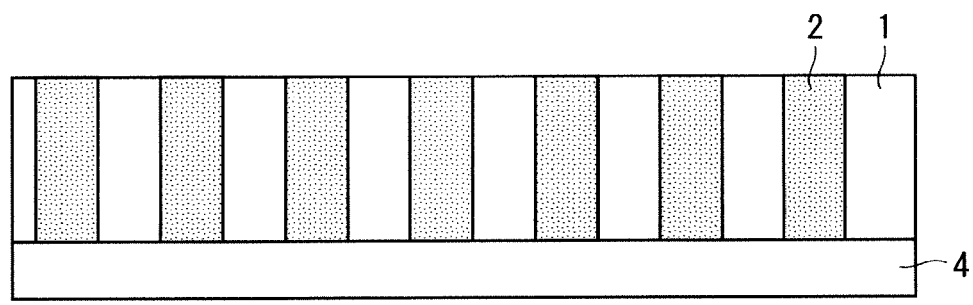
F I G . 1 7
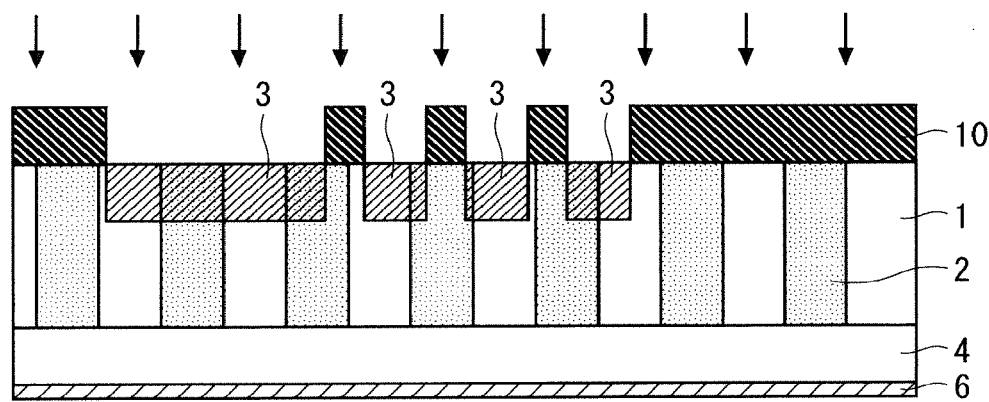

SEMICONDUCTOR DEVICE

TECHNICAL FIELD

The present invention relates to a semiconductor device, and particularly to a semiconductor device having a structure called a super junction structure.

BACKGROUND ART

An electrical resistance of a vertical semiconductor device largely depends on an electrical resistance in a portion of a conductive layer called a "drift layer". The electrical resistance in the drift layer is determined by an impurity concentration thereof, thus if the impurity concentration is increased, an ON resistance can be reduced. However, the impurity concentration of the drift layer cannot be increased to a limit or more determined by a withstand voltage required of a semiconductor device. That is to say, there is a trade-off relationship between the electrical resistance and the withstand voltage in the semiconductor device.

Known as one of methods of improving the trade-off is a structure that a p-type pillar layer and an n-type pillar layer both having a reed shape in cross-section are alternately formed in the drift layer. Such a structure of the drift layer is called a "super junction structure".

In a semiconductor device having a conventional drift layer made up of a single conductivity type layer, a depletion layer expands from a surface of the drift layer in a vertical direction at reverse bias, thereby holding a high voltage In the meanwhile, in a semiconductor device having the super junction structure, a depletion layer expands from a PN junction between a p-type pillar layer and an n-type pillar layer in a lateral direction, thereby holding a high voltage. Accordingly, in the semiconductor device having the super junction structure, a high withstand voltage can be maintained by adjusting an amount of impurity in the p-type pillar layer and the n-type pillar layer to be a comparable level even when the impurity concentration of the drift layer is extremely high. A current can be flowed through the n-type pillar layer having the extremely high impurity concentration, thus a low ON resistance beyond a material limit can be achieved.

In the semiconductor device, a termination region for ensuring a withstand voltage in mainly an outer periphery of the semiconductor device is provided outside an active region in which the current is actively flowed. For example, Patent Document 1 described below discloses a structure of providing a termination region in which p-type pillar layers and n-type pillar layers having a shape surrounding four sides of an active region are alternately disposed in a semiconductor device having the super junction structure.

PRIOR ART DOCUMENTS

Patent Documents

Patent Document 1: Japanese Patent Application Laid-Open No. 2006-269720

SUMMARY

Problem to be Solved by the Invention

For example, known is a semiconductor device, such as a semiconductor device formed using a semiconductor substrate made of silicon carbide (SiC), in which the semiconductor substrate has an off-angle for keeping a crystal structure of a drift layer. The off-angle is an angle provided between a main surface of the semiconductor substrate and a specific crystal surface, and is an angle between a main surface of an SiC substrate and a {0001} plane in a case of an SiC substrate having a {0001} plane. In an epitaxial growth on the semiconductor substrate having the off-angle, a growth in a lateral direction occurs from a difference in level between atomic planes. The growth in the lateral direction is called a "step-flow growth" and a direction of the growth is called a "step-flow direction". That is to say, the step-flow direction coincides with a direction of the off-angle.

Although a detailed description is described below, if the super junction structure is formed on the semiconductor substrate having the off-angle by the epitaxial growth, it is difficult to form the p-type pillar layer and the n-type pillar layer expanding in a direction other than the direction of the off-angle (the step-flow direction). Thus, in the semiconductor device formed using the substrate having the off-angle, it is difficult to form the p-type pillar layer and the n-type pillar layer having the shape surrounding the four sides of the active region in the termination region as Patent Document 1.

The present invention therefore has been made to solve the above problems, and it is an object of the present invention to provide a structure of a termination region suitable for a semiconductor device which is formed using a semiconductor substrate with an off-angle and has a super junction structure.

Means to Solve the Problem

A semiconductor device according to the present invention includes: a semiconductor substrate having an off-angle; a drift layer of a first conductivity type formed on the semiconductor substrate; a plurality of pillar regions of a second conductivity type formed in the drift layer; a surface electrode formed on the drift layer including the plurality of pillar regions; and a plurality of withstand voltage holding structures of a second conductivity type formed in a surface layer of the drift layer including the plurality of pillar regions to surround an active region, wherein each of the plurality of pillar regions has a linear shape extending in a direction of the off-angle, each of the plurality of withstand voltage holding structures has a frame-like shape including sides extending in parallel with the plurality of pillar regions and sides perpendicular to the plurality of pillar regions in a planar view.

Effects of the Invention

According to the semiconductor device of the present invention, a local electrical field concentration in a termination region is reduced at each side and a corner portion of the semiconductor device, and a resistance can be reduced while retaining a high withstand voltage.

BRIEF DESCRIPTION OF DRAWINGS

FIG. 15 A schematic cross-sectional view illustrating a method of manufacturing the SBD according to the embodiment 1.

FIG. 16 A schematic cross-sectional view illustrating a method of manufacturing the SBD according to the embodiment 1.

FIG. 17 A schematic cross-sectional view illustrating a method of manufacturing the SBD according to the embodiment 1.

DESCRIPTION OF EMBODIMENT(S)

Figure 1:
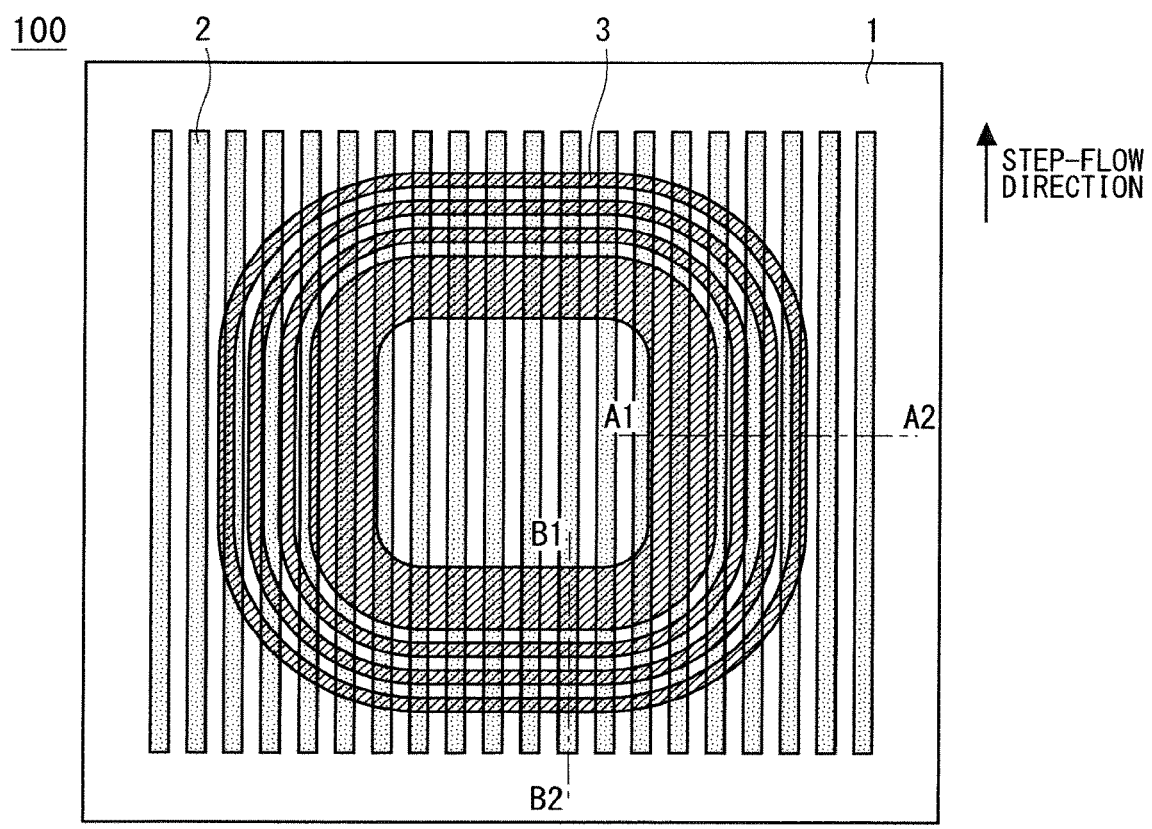
FIG. 1 A schematic plan view of a drift layer of an SBD according to an embodiment 1.

Embodiments of the present invention is described with reference to the drawings. Since each drawing is a schematic view, a size or a position of each element illustrated therein is not necessarily accurate, but can be appropriately changed. The same reference numerals will be assigned to the elements having the similar function in the plurality of drawings. Thus, the description of the elements having the same reference numeral as those described already may be omitted to prevent a duplicated description. In the description hereinafter, terms indicating a specific position and direction, such as "upper", "lower", "vertical", "lateral", "inside", "outside", "a side", "a bottom", "a front side", and "a back side" may be used, however, these terms are used to simplify the description as a matter of convenience, thus do not specify an actual direction in a manufacture according to the present invention.

"One" element described in the embodiments may be "one or more" elements unless there is an inconsistency. An individual element constituting the invention is described as a conceptual unit, thus one element may be made up of a plurality of structure, and one element may constitute a part of a structure. Each element may have a different structure or a shape as long as it has the same function.

A silicon carbide (SiC) semiconductor device having a vertical structure is described in the embodiments hereinafter as an example of a semiconductor device having a super junction structure. In the description hereinafter, a first conductivity type is an n type, and a second conductivity type is a p type.

Embodiment 1

Figure 2:
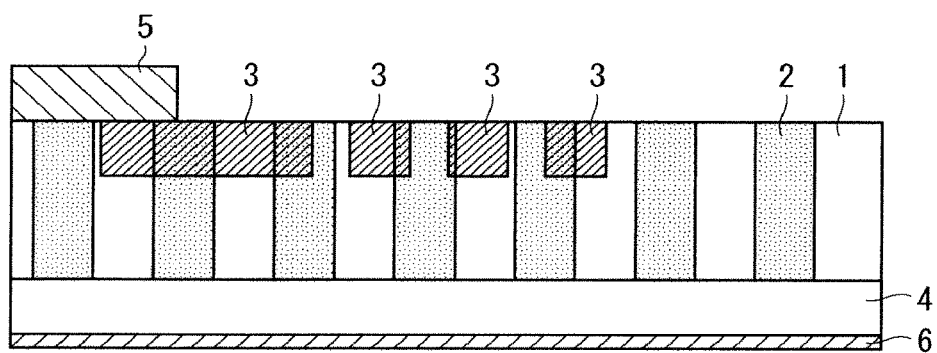
FIG. 2 A schematic cross-sectional view of the SBD according to the embodiment 1.
Figure 3:
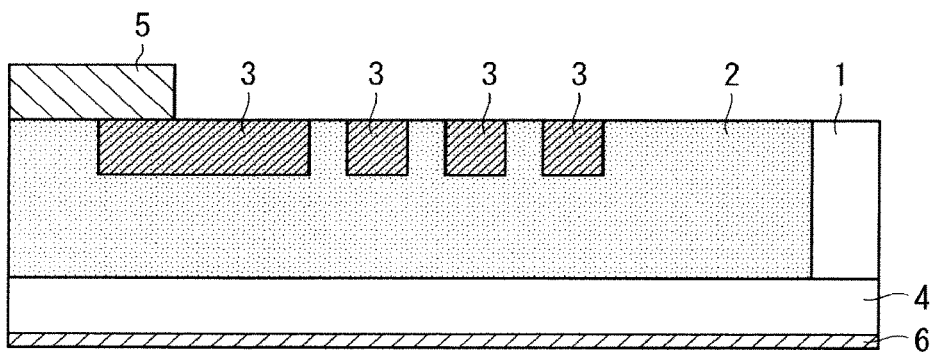
FIG. 3 A schematic cross-sectional view of the SBD according to the embodiment 1.

FIG. 1 to FIG. 3 are schematic drawings illustrating a configuration of a Schottky barrier diode (SBD) which is a semiconductor device 100 according to the embodiment 1. FIG. 1 is a plan view illustrating a surface structure of a drift layer 1 of the semiconductor device 100, FIG. 2 is a cross-sectional view along A1-A2 in FIG. 1, and FIG. 3 is a cross-sectional view along B1-B2 in FIG. 1. A diode to which the present invention is applied is not limited to the SBD, but can also be applied to a PN junction diode or a junction barrier Schottky (JBS) diode, for example.

As illustrated in FIG. 2 and FIG. 3, the semiconductor device 100 is formed using a semiconductor substrate 4 which is made up of an n-type SiC having an off-angle. The n-type drift layer 1 is formed on the semiconductor substrate 4 by an epitaxial growth. A step-flow direction in forming the drift layer 1 is the same as a direction of the off-angle of the semiconductor substrate 4. Thus, the "step-flow direction" illustrated in FIG. 1 indicates the direction of the off-angle of the semiconductor substrate 4.

A plurality of p-type pillar regions 2 are formed in the drift layer 1. As illustrated in FIG. 1, each p-type pillar region 2 has a linear shape extending in the step-flow direction in a planar view. That is to say, the plurality of p-type pillar regions 2 extend in parallel with each other, and provided to have a striped shape.

As illustrated in FIG. 2 and FIG. 3, a surface electrode 5 is formed as an anode electrode of the SBD on the drift layer 1 including the p-type pillar region 2. A back surface electrode 6 is formed as a cathode electrode of the SBD on a lower surface of the semiconductor substrate 4. The surface electrode 5 has a Schottky connection to the drift layer 1 and the p-type pillar region 2, and the back surface electrode 6 has an ohmic connection to the semiconductor substrate 4.

A plurality of frame-like withstand voltage holding structures 3 made up of a p-type semiconductor region are formed in a surface layer of the drift layer 1 including the p-type pillar region 2 to surround the surface electrode 5. A region surrounded by the withstand voltage holding structures 3 is an active region of the semiconductor device 100, and a formation region of the withstand voltage holding structure 3 and an outer side thereof are a termination region of the semiconductor device 100.

As illustrated in FIG. 1, each withstand voltage holding structure 3 includes sides extending in parallel with the p-type pillar region 2 and sides perpendicular to the p-type pillar region 2 in a planar view. In the present embodiment, a chip of the semiconductor device 100 has a rectangular shape having sides horizontal to the step-flow direction and sides normal to the step-flow direction. Thus, each withstand voltage holding structure 3 extends in parallel with the p-type pillar region 2 in a neighborhood of the sides of the semiconductor device 100 parallel to the step-flow direction, and each withstand voltage holding structure 3 extends to be perpendicular to the p-type pillar region 2 in a neighborhood of the sides of the semiconductor device 100 normal to the step-flow direction.

In the present embodiment, at least one of the plurality of withstand voltage holding structures 3 is formed to have an overlap with a part of the surface electrode 5 in a planar view. More specifically, as illustrated in FIG. 2 and FIG. 3, the withstand voltage holding structure 3 located on an innermost side is formed to have an overlap with an end portion of the surface electrode 5.

Figure 4:
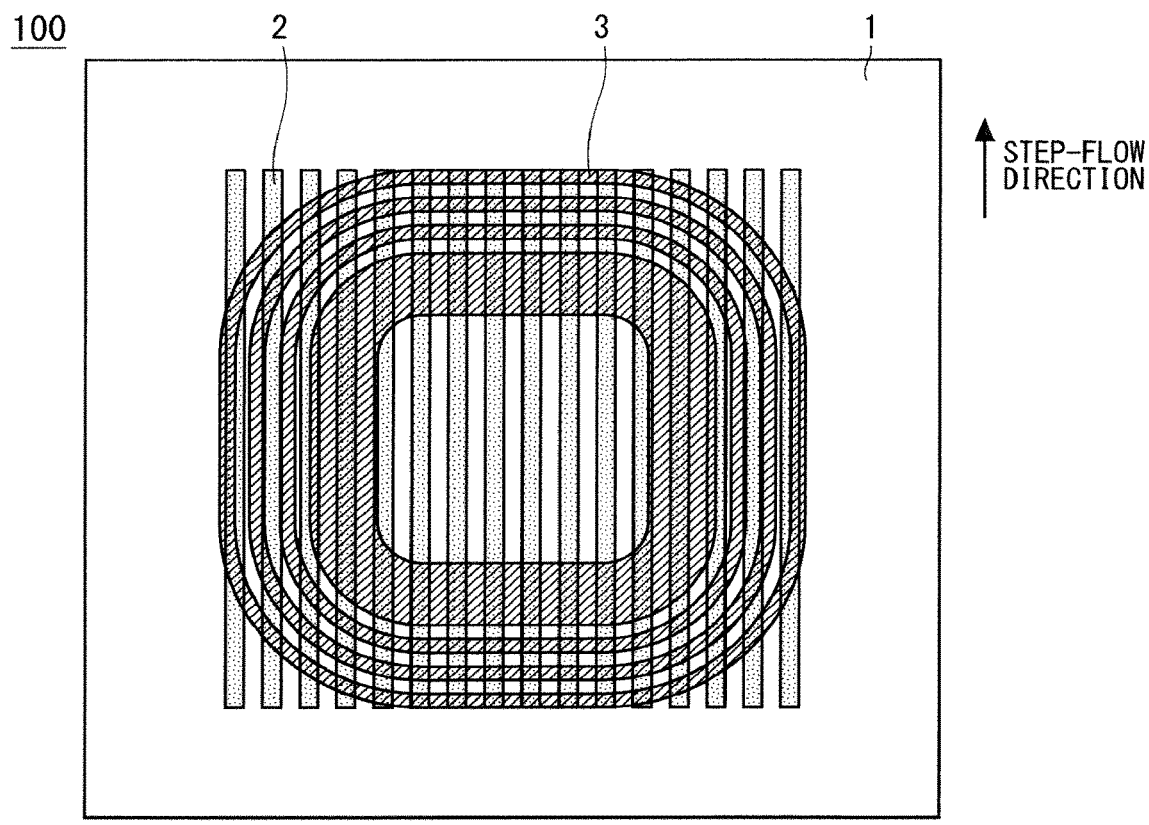
FIG. 4 A schematic plan view illustrating a modification example of the SBD according to the embodiment 1.
Figure 5:
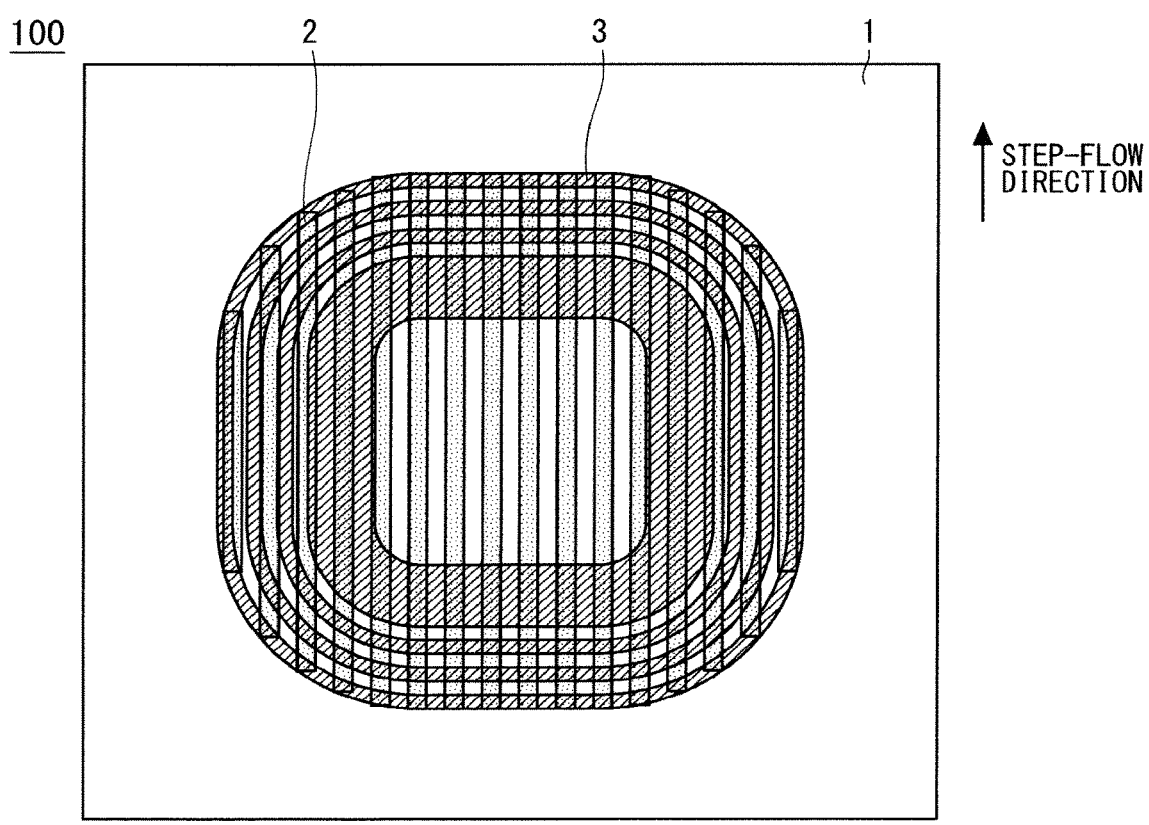
FIG. 5 A schematic plan view illustrating a modification example of the SBD according to the embodiment 1.

A layout of the p-type pillar region 2 and the withstand voltage holding structure 3 is not limited to that illustrated in FIG. 1. For example, in FIG. 1, the plurality of p-type pillar regions 2 are also formed on an outer side of an outermost periphery of the withstand voltage holding structure 3 with respect to the direction normal to the step-flow direction, however, the p-type pillar region 2 may be formed only on an inner side of the outermost periphery of the withstand voltage holding structure 3 as illustrated in FIG. 4. In FIG. 1, all of the p-type pillar regions 2 extend to the outer side of the outermost periphery of the withstand voltage holding structure 3 with respect to the direction parallel to the step-flow direction, however, it is also applicable that as illustrated in FIG. 4, a length of each p-type pillar region 2 is adjusted to a length of the withstand voltage holding structure 3 in the step-flow direction to fit the p-type pillar region 2 within the inner side of the outermost periphery of the withstand voltage holding structure 3 except for a corner portion of the withstand voltage holding structure 3. It is also applicable that as illustrated in FIG. 5, the length of each p-type pillar region 2 is adjusted in accordance with a shape of the corner portion of the withstand voltage holding structure 3, thereby forming the p-type pillar region 2 only on the inner side of the outermost periphery of the withstand voltage holding structure 3.

Figure 6:
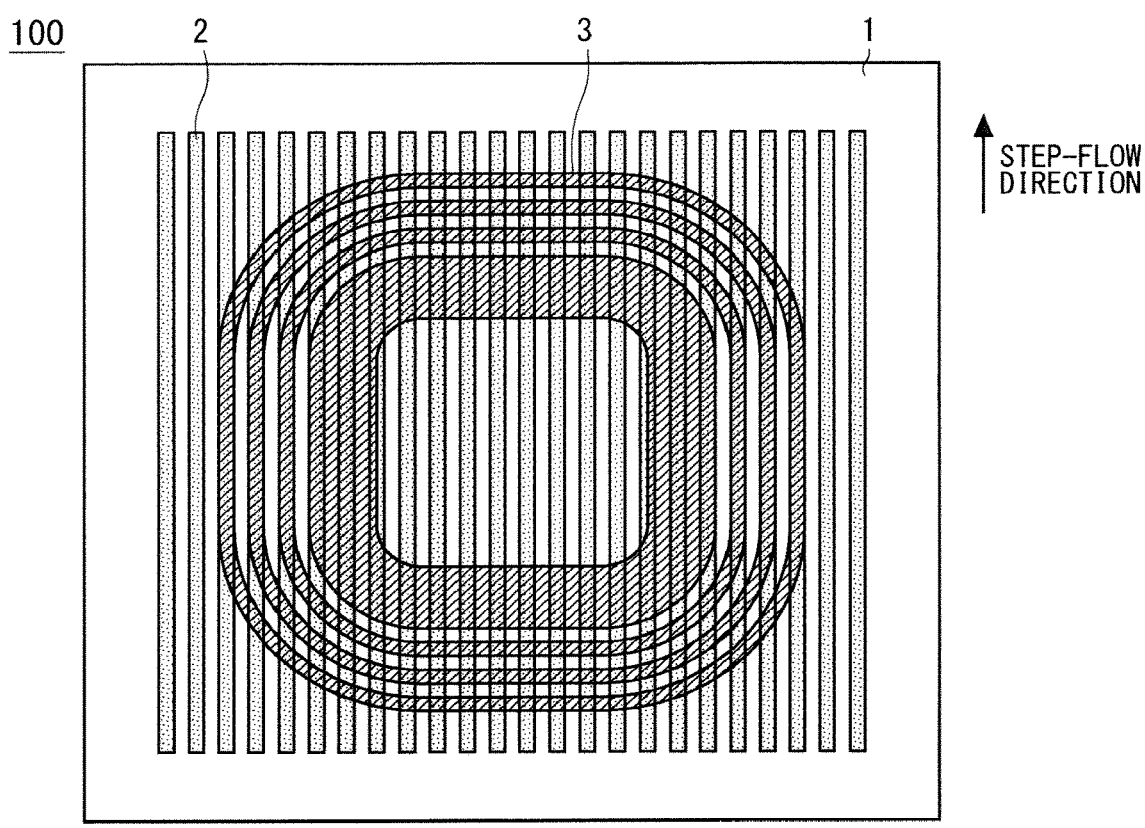
FIG. 6 A schematic plan view illustrating a modification example of the SBD according to the embodiment 1.

It is also applicable that as illustrated in FIG. 6, a pitch of the withstand voltage holding structures 3 except for the withstand voltage holding structure 3 located on the innermost side is set to be the same as a pitch of the p-type pillar regions 2 to make each side of the withstand voltage holding structures 3 except for the innermost withstand voltage holding structure 3 extending in parallel with the p-type pillar regions 2 have an overlap with each p-type pillar region 2. At this time, each side of the withstand voltage holding structure 3 extending in parallel with the p-type pillar region 2 may be formed to have a width narrower than that of the p-type pillar region 2 not to protrude from one p-type pillar region 2, or may be formed to have a width equal to wider than that of the p-type pillar region 2 to cover the whole width of one p-type pillar region 2.

Figure 7:
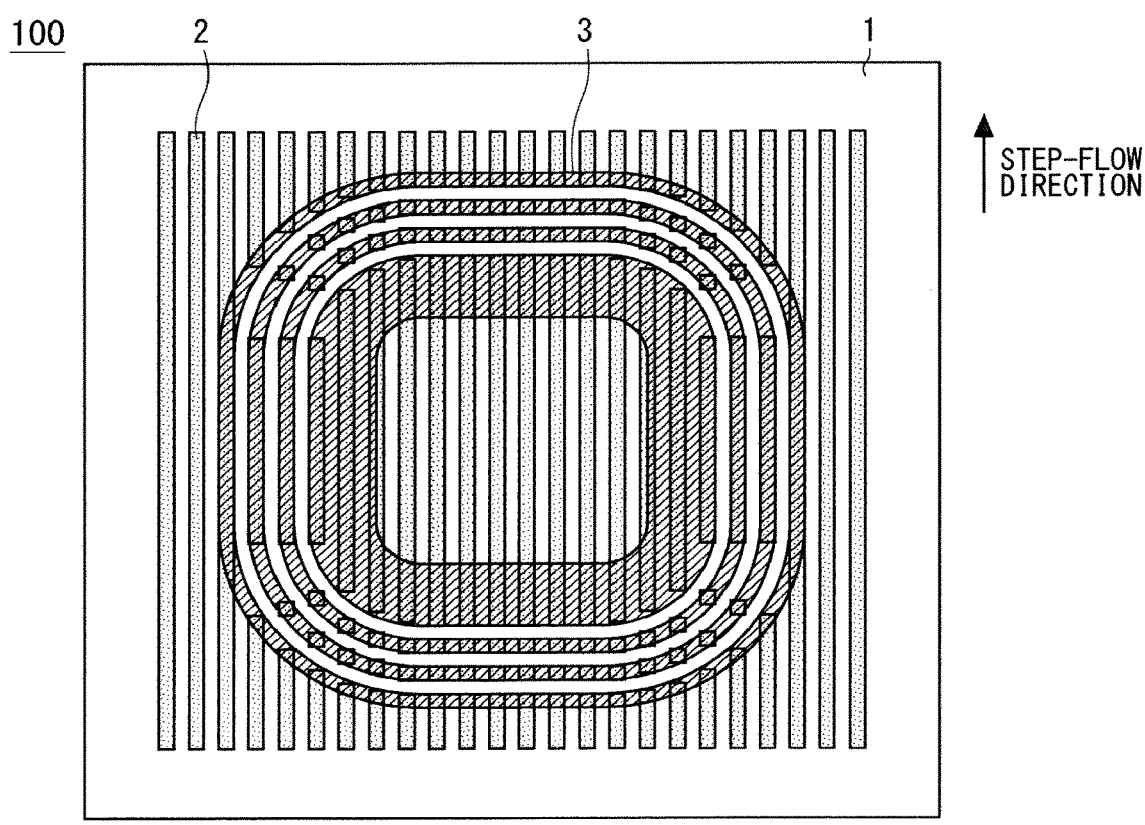
FIG. 7 A schematic plan view illustrating a modification example of the SBD according to the embodiment 1.

As illustrated in FIG. 7, the p-type pillar region 2 may have an intermissive linear shape with a disconnection in a region where the withstand voltage holding structure 3 is not formed. However, the p-type pillar region 2 is formed in the active region surrounded by the innermost withstand voltage holding structure 3.

Figure 8:
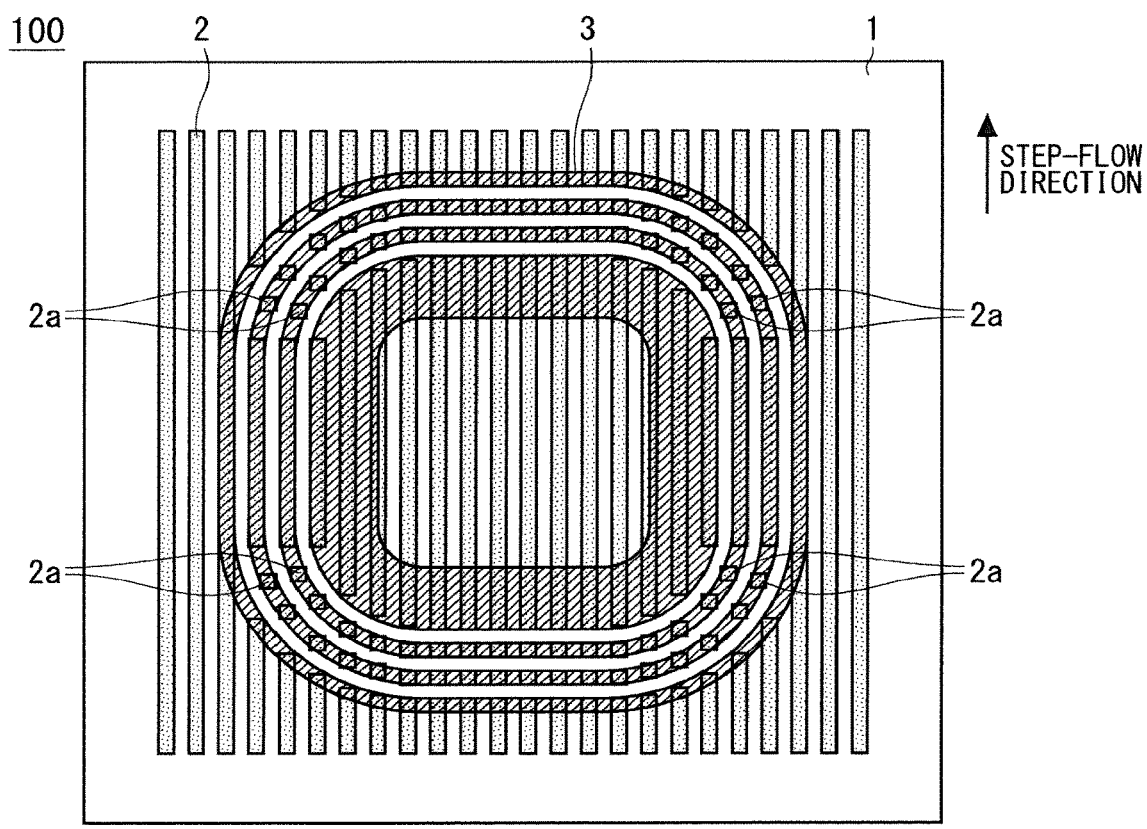
FIG. 8 A schematic plan view illustrating a modification example of the SBD according to the embodiment 1.

If the p-type pillar region 2 has the intermissive linear shape as illustrated in FIG. 7, an interval between the p-type pillar regions 2 may partially increase. In such a case, a local p-type pillar region 2a may be added to a portion where the interval between the p-type pillar regions 2 increases as illustrated in FIG. 8. The local p-type pillar region 2a is formed in a position having an overlap with any of the withstand voltage holding structures 3 in a planar view. If the local p-type pillar region 2a has a length equal to or longer than a certain length, the local p-type pillar region 2a has a shape extending in parallel with the step-flow direction in the manner similar to the linear p-type pillar region 2.

Figure 9:
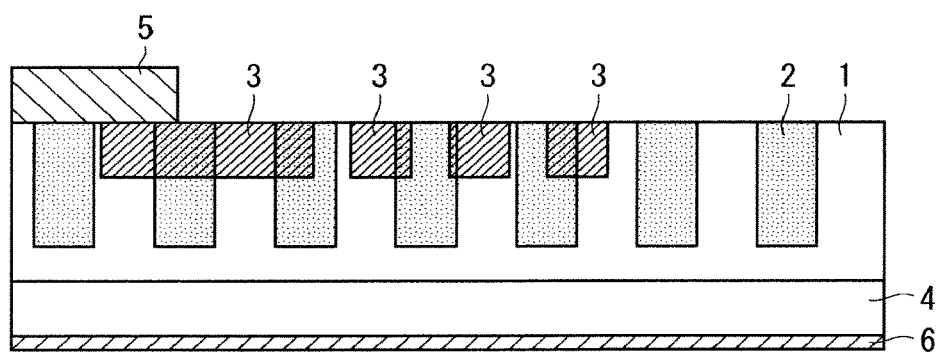
FIG. 9 A schematic cross-sectional view illustrating a modification example of the SBD according to the embodiment 1.
Figure 10:
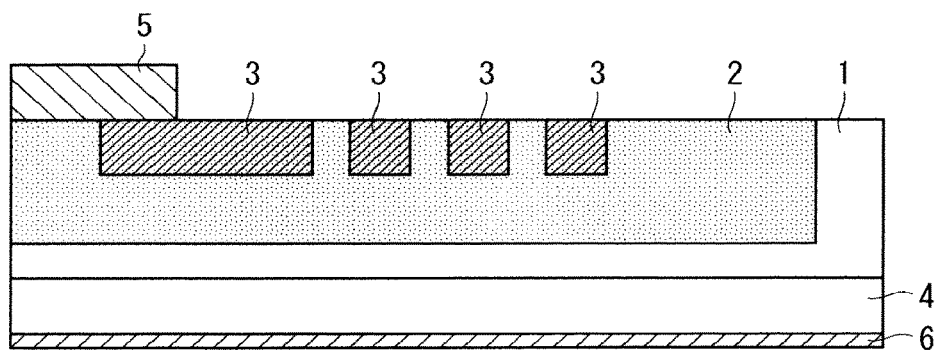
FIG. 10 A schematic cross-sectional view illustrating a modification example of the SBD according to the embodiment 1.

In the meanwhile, with regard to a cross-sectional structure of the semiconductor device 100, a bottom of the p-type pillar region 2 reaches a bottom of the drift layer 1 in FIG. 2 and FIG. 3, however, the bottom of the p-type pillar region 2 may be separated from the bottom of the drift layer 1 as illustrated in FIG. 9 and FIG. 10. That is to say, a depth of the p-type pillar region 2 may be smaller than a thickness of the drift layer 1.

Figure 11:
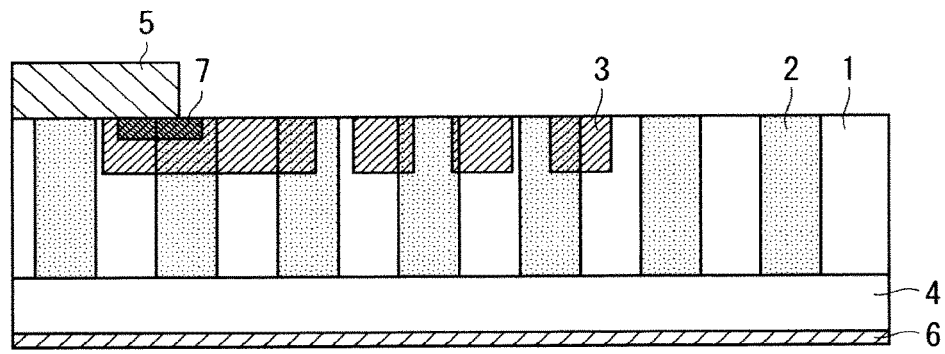
FIG. 11 A schematic cross-sectional view illustrating a modification example of the SBD according to the embodiment 1.

Furthermore, as illustrated in FIG. 11, a high concentration p region 7 having an impurity concentration higher than that of the withstand voltage holding structure 3 may be provided in a position in the surface layer of the withstand voltage holding structure 3 having an overlap with the surface electrode 5. Herein, the high concentration p region 7 is provided to have a contact with the end portion of the surface electrode 5. Although, in the example of FIG. 11, both the withstand voltage holding structure 3 and the high concentration p region 7 have a contact with a surface of the drift layer 1 including the p-type pillar region 2, also applicable is a configuration that one or none of them has the contact with a surface of the drift layer 1.

Figure 12:
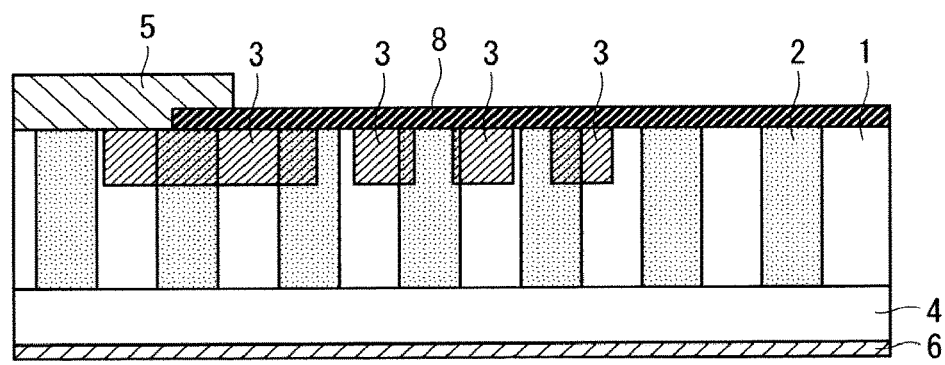
FIG. 12 A schematic cross-sectional view illustrating a modification example of the SBD according to the embodiment 1.
Figure 13:
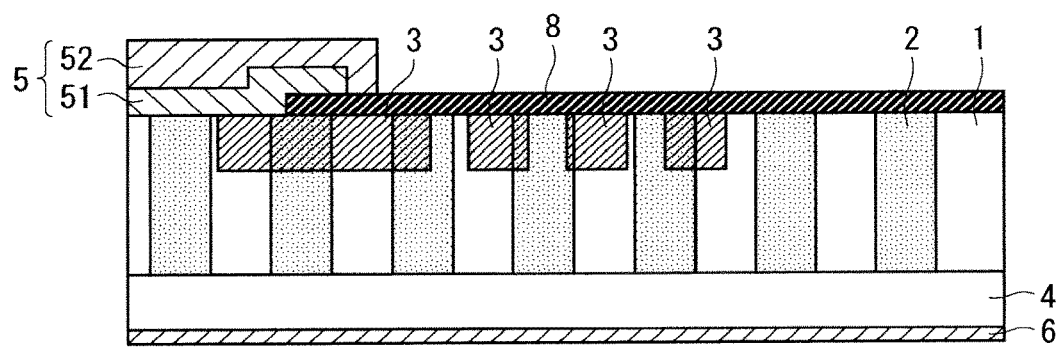
FIG. 13 A schematic cross-sectional view illustrating a modification example of the SBD according to the embodiment 1.

As illustrated in FIG. 12, a field insulating film 8 may be formed on the drift layer 1 including the p-type pillar region 2 to cover the withstand voltage holding structure 3. The field insulating film 8 is provided to surround the surface electrode 5 in the manner similar to the withstand voltage holding structure 3. Furthermore, as illustrated in FIG. 13, the surface electrode 5 may have a double-layered structure of conductive films 51 and 52.

Next, a method of manufacturing the semiconductor device 100 according to the embodiment 1 is described. FIG. 14 to FIG. 17 are process drawings illustrating the manufacturing method thereof, and these processing drawings correspond to the cross-sectional surface in FIG. 2, that is to say, the cross-sectional surface along A1-A2 in FIG. 1.

Firstly, the semiconductor substrate 4 made up of the n-type SiC having the off-angle is prepared, and the n-type drift layer 1 is epitaxially grown on the surface of the semiconductor substrate 4 by a chemical vapor deposition (CVD) method. The thickness of the drift layer 1 is within a range of 2 μm to 150 μm. Nitrogen (N), for example, can be used as an n-type dopant introduced into the drift layer 1, and the impurity concentration of the drift layer 1 is within a range of $1 \times 10^{15}$ cm$^{-3}$ to $1 \times 10^{17}$ cm$^{-3}$.

Figure 14:
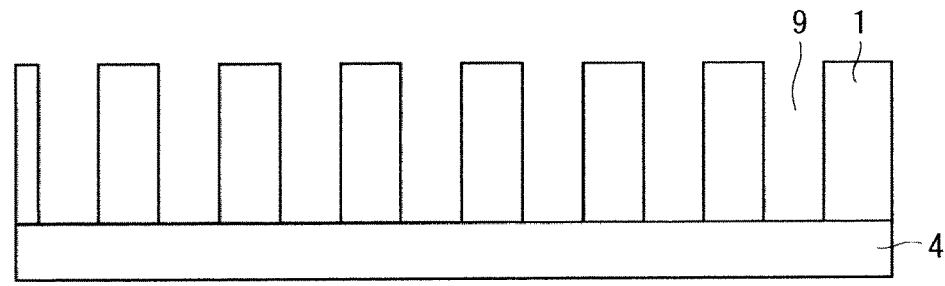
FIG. 14 A schematic cross-sectional view illustrating a method of manufacturing the SBD according to the embodiment 1.

Next, a silicon oxide film is formed on the surface of the drift layer 1 by the CVD method, for example, and the silicon oxide film is patterned using a photolithography technique to form an etching mask in which a formation region of the p-type pillar region 2 is opened. Then, a selective etching is performed on the drift layer 1 using the etching mask by a reactive ion etching (RIE), and the etching mask is removed by hydrofluoric acid treatment. As a result, trenches 9 having a pattern corresponding to the p-type pillar region 2 are formed in the drift layer 1 as illustrated in FIG. 14. That is to say, the trenches 9 are formed to have a striped pattern extending in parallel with the direction of the off-angle of the semiconductor substrate 4. A width of each trench 9 is within a range of 1 to 5 μm, and an interval between the trenches 9 is within a range of 1 to 15 μm.

Subsequently, a p-type semiconductor 20 which is to be the p-type pillar region 2 is epitaxially grown to fill the trenches 9 in the drift layer 1 by the CVD method as illustrated in FIG. 15. Aluminum (Al) or boron (B), for example, can be used as a dopant introduced into the p-type semiconductor 20, that is to say, the p-type pillar region 2, and an impurity concentration thereof is within the same range as the impurity concentration of the drift layer 1.

In the epitaxial growth of the p-type semiconductor 20, the growth proceeds from an upstream toward a downstream of the step-flow direction (the direction of the off-angle) in bottoms of the trenches 9, and the growth further occurs from sidewalls of the trenches 9. Since the trenches 9 are formed in the direction parallel to the step-flow direction in the present embodiment, the growth occurs at the sidewalls on both sides of each trench 9 in the same condition, and is combined with the growth from the bottom to form the p-type pillar region 2 in the trenches 9.

If the trenches 9 are formed to have a striped shape in the direction normal to the step-flow direction, the growth of the p-type semiconductor 20 is further promoted on the upstream side of the sidewalls in the step-flow direction in the sidewalls of the trenches 9. Thus, the growth from the bottoms and the downstream side of the sidewalls of the trenches 9 does not catch up with the growth from the upstream side of the sidewalls, and there is a high possibility of an occurrence of a void or a crystal defect in the p-type pillar region 2. If there is the void or the crystal defect in the p-type pillar region 2 constituting the super junction structure, a desired withstand voltage cannot be obtained, so that reliability of the semiconductor device is reduced. In the present embodiment, the trenches 9 are formed in the direction parallel to the step-flow direction to avoid this problem.

After the p-type semiconductor 20 is formed as illustrated in FIG. 15, the surface of the drift layer 1 is flattened by performing a chemical mechanical polishing (CMP) to form the p-type pillar regions 2 in the trenches 9 as illustrated in FIG. 16. Then, a photoresist 10 in which the formation region of the withstand voltage holding structure 3 is opened by the photolithography technique is forming on the drift layer 1 including the p-type pillar regions 2, and a selective ion implantation is performed using the photoresist 10 as a mask, thereby forming the plurality of withstand voltage holding structures 3 in the surface of the drift layer 1. Al or B, for example, can be adopted as an ion species implanted into the withstand voltage holding structure 3. The impurity concentration of the withstand voltage holding structure 3 is higher than that of the drift layer 1, and is set to be equal to or smaller than $1.0 \times 10^{18}$ cm$^{-3}$.

Herein, the high concentration p region 7 illustrated in FIG. 11 may be formed by repeating the mask formation using the photolithography technique and the ion implantation. Al or B, for example, can also be adopted as an ion species implanted into the high concentration p region 7. The impurity concentration of the high concentration p region 7 is set to be higher than that of the withstand voltage holding structure 3.

Subsequently, annealing is performed for thirty seconds to one hour in an inactive gas atmosphere (1300° C. to 1900° C.) such as an argon (Ar) gas using a thermal treatment device. The ions implanted in the process described above are electrically activated by the annealing.

Herein, the field insulating film 8 illustrated in FIG. 12 or FIG. 13 may be formed by forming the silicon oxide film on the surface of the drift layer 1 including the p-type pillar region 2 by the CVD method, for example, and patterning the silicon oxide film by the selective etching using the photolithography technique.

Subsequently, the surface electrode 5 is formed on an upper surface of the drift layer 1 including the p-type pillar region 2 and the back surface electrode 6 is formed on a lower surface of the semiconductor substrate 4 by a sputtering method or an evaporation method, for example, thus the semiconductor device 100 having the configuration illustrated in FIG. 2 is completed.

One or a plurality of metals such as titanium (Ti), molybdenum (Mo), tungsten (W), and Al can be adopted as a material of the surface electrode 5, and one or a plurality of metals such as nickel (Ni) and gold (Au), for example, can be adopted as a material of the back surface electrode 6.

An operation of the semiconductor device 100 is described next. Separately described herein are an operation of a "forward bias state" where potential higher than that of the back surface electrode 6 is applied to the surface electrode 5 and an operation of a "reverse bias state" where potential higher than that of the surface electrode 5 is applied to the back surface electrode 6.

In the forward bias state, when a voltage between the surface electrode 5 and the back surface electrode 6 exceeds a certain value, a current flows from the surface electrode 5 toward the back surface electrode 6. The voltage at a start of the current flowing differs depending on the material, the formation method, and the thermal treatment method, for example, of the surface electrode 5, but is substantially 0.5 V to 2 V.

In the semiconductor device 100 having the super junction structure, the current hardly flows in the p-type pillar region 2 having a large Schottky barrier with the surface electrode 5, however, the drift layer 1 has the extremely high impurity concentration and the low electrical resistance, thus a power consumption can be extremely reduced compared to a semiconductor device which does not have the super junction structure.

In the meanwhile, in the reverse bias state, a depletion layer extends in the drift layer 1 and the p-type pillar region 2, thus the current between the surface electrode 5 and the back surface electrode 6 is blocked. In the super junction structure, the depletion layer also extends in the lateral direction from the PN junction between the drift layer 1 and the p-type pillar region 2, thus a sufficient withstand voltage can be ensured even if the impurity concentration of the drift layer 1 is extremely high.

Figure 18:
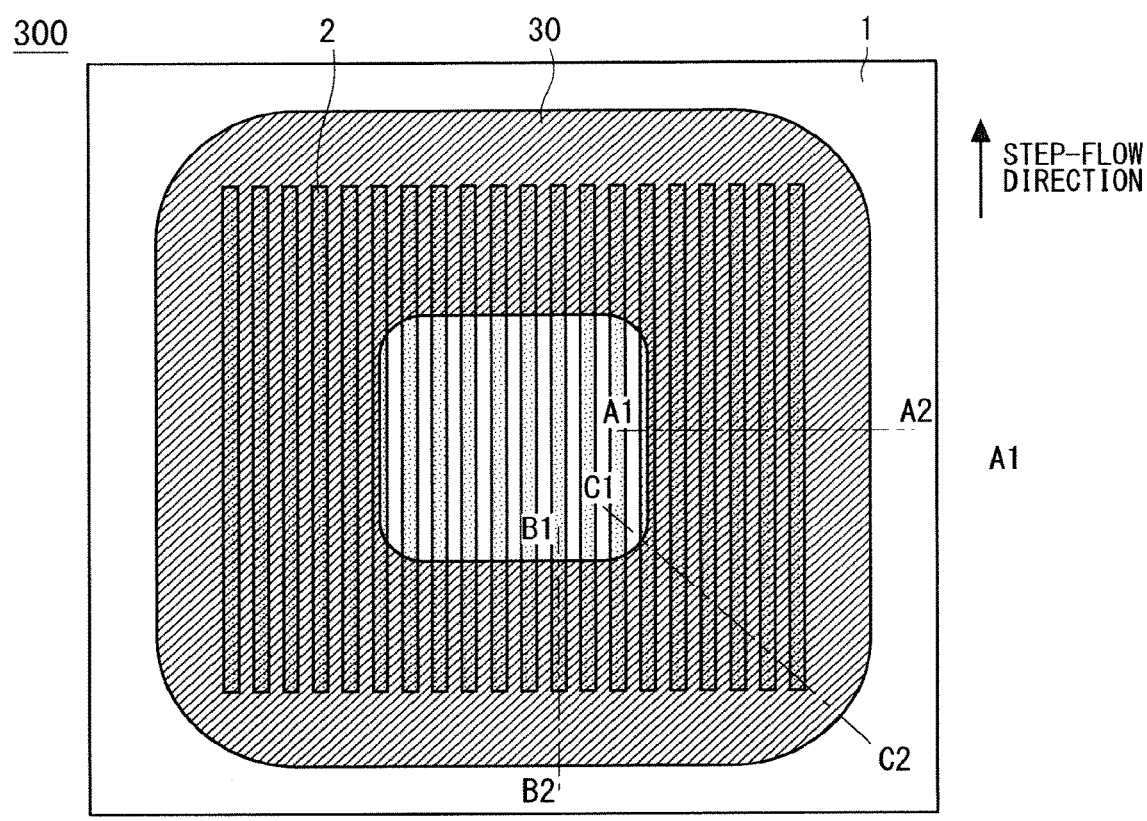
FIG. 18 A schematic plan view of a drift layer of a conventional SBD.

Known as the structure of the termination region of the semiconductor device having the super junction structure is a structure called a junction termination extension (JTE) or a reduced surface field (RESURF) in which only one frame-like withstand voltage holding structures 30 made up of a p-type semiconductor region is used as illustrated in FIG. 18, and Patent Document 1 described above also discloses such a structure. The withstand voltage holding structure 30 in FIG. 18 is referred to as a "conventional withstand voltage holding structure", and a semiconductor device 300 having the conventional withstand voltage holding structure 30 is referred to as a "conventional semiconductor device".

Figure 19:
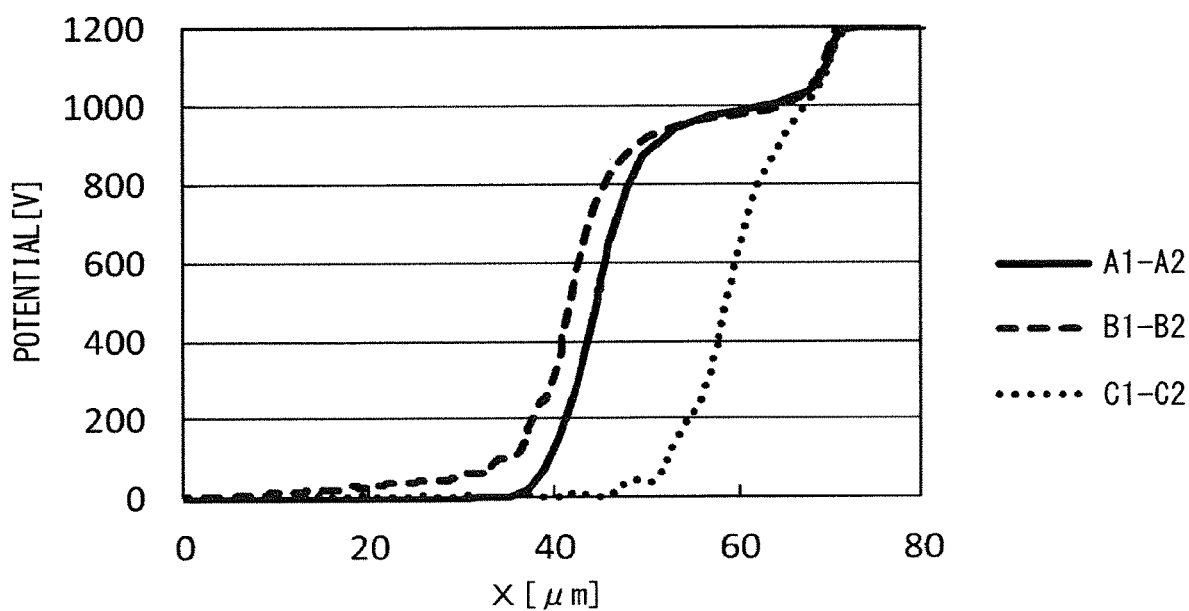
FIG. 19 A drawing illustrating a simulation result of a potential distribution in the conventional SBD.

FIG. 19 illustrates a simulation result of a potential distribution in each cross-sectional surface along a line A1-A2, a line B1-B2, and a line C1-C2 in a case where the conventional semiconductor device 300 illustrated in FIG. 18 is in the reverse bias state. In a graph in FIG. 19, a horizontal axis indicates a position in the conventional semiconductor device 300, and a position is located closer to a center of a chip as a value of the horizontal axis decreases. A vertical axis indicates potential in the surface of the drift layer 1. The convention semiconductor device 300 in the simulation is also an SBD having the super junction structure, and the p-type pillar regions 2 thereof have a striped shape extending in the step-flow direction. Both the drift layer 1 and the p-type pillar region 2 have a width of 2 μm, a depth of 10 μm, and an impurity concentration of $3\times10^{16}$ $cm^{-3}$. The potential of the back surface electrode 6 with respect to the surface electrode 5 is set to 1200 V.

A potential gradient in a direction horizontal to the surface of the drift layer 1 mainly occurs inside the withstand voltage holding structure 3, and as can be seen from the simulation result in FIG. 19, in the conventional semiconductor device 300, the potential gradient along the line C1-C2 is located closer to an outer side than the potential gradients along the cross-sectional surfaces along the line A1-A2 and the line B1-B2. This indicates that the potential distribution significantly changes around the line C1-C2 (that is to say, a corner portion of the chip) from the position of the line A1-A2 to the position of the line B1-B2 via the position of the line C1-C2, and equipotential lines are extremely close to each other. Since an electrical field is concentrated in a portion where the equipotential lines are close to each other, the electrical field reaches a critical electrical field at the corner portion of the chip before a desired voltage is applied to the back surface electrode 6, and an avalanche breakdown occurs.

Considered as a cause thereof is that all of the p-type pillar regions 2 extend in the same direction. That is to say, since the structure of the termination region differs in each cross-sectional surface of the line A1-A2 and the line B1-B2, a potential balance is lost at the corner portion which is a joint therebetween, and a local electrical field concentration occurs in the corner portion.

Figure 20:
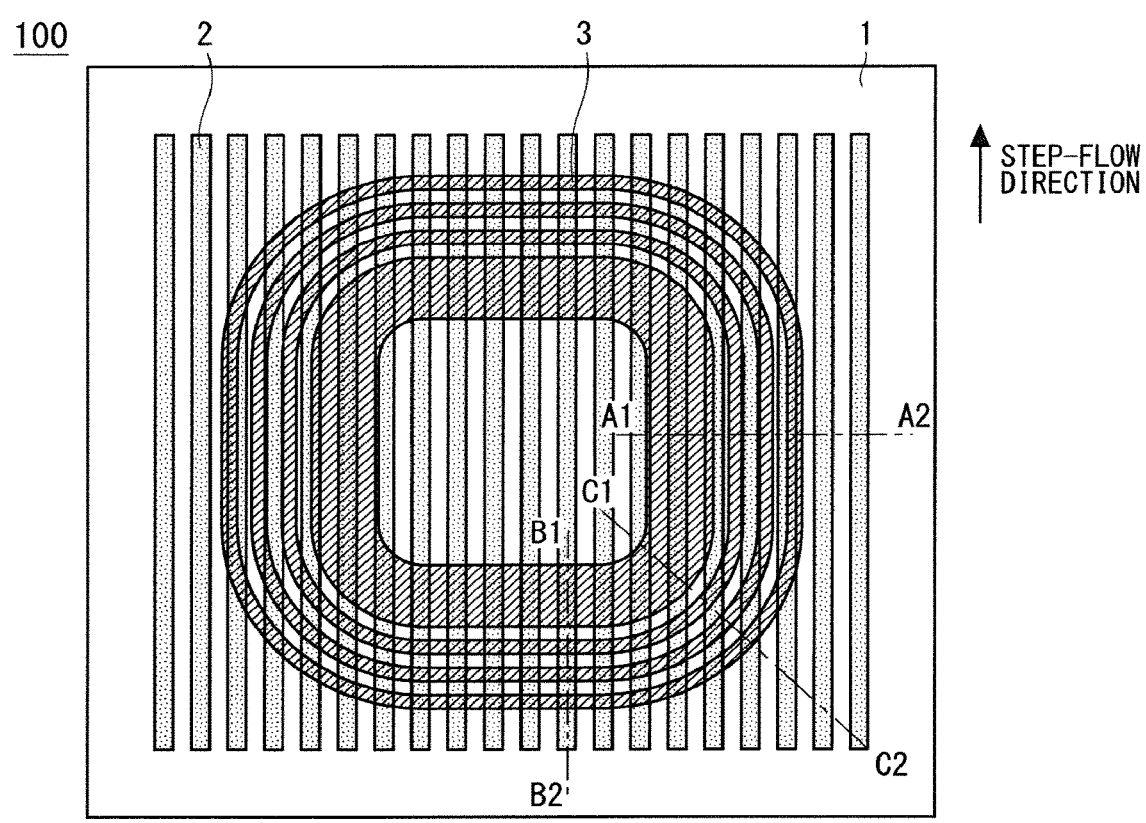
FIG. 20 A schematic plan view of the drift layer of the SBD according to the embodiment 1.
Figure 21:
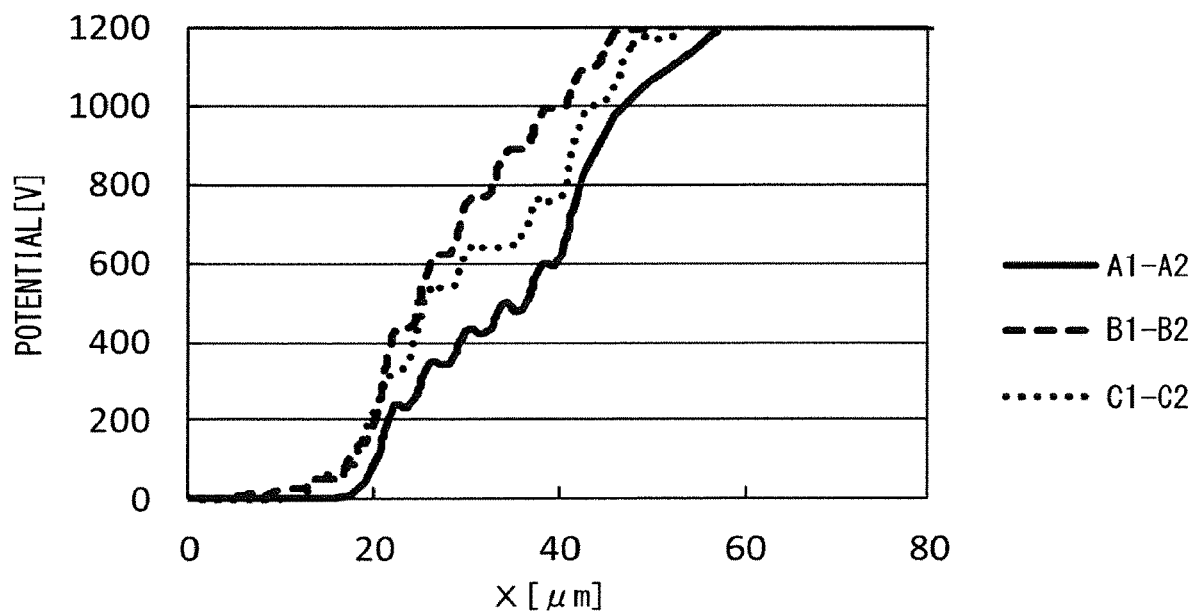
FIG. 21 A drawing illustrating a simulation result of a potential distribution in the SBD according to the embodiment 1.

In the meanwhile, FIG. 20 illustrates the semiconductor device 100 of the embodiment 1 as well as FIG. 1. FIG. 21 illustrates a simulation result of a potential distribution in each cross-sectional surface along the line A1-A2, the line B1-B2, and the line C1-C2 in a case where the semiconductor device 100 of the embodiment 1 is in the reverse bias state. Also in a graph in FIG. 21, a position is located closer to a center of a chip as a value of a horizontal axis decreases, and a vertical axis indicates potential in the surface of the drift layer 1. Conditions such as the width, the depth, and the impurity concentration of the drift layer 1 and the p-type pillar region 2 and the potential of surface electrode 5 and back surface electrode 6 in this simulation are the same as those in the simulation of the conventional semiconductor device 300.

As illustrated in FIG. 21, in the simulation result of the semiconductor device 100 of the embodiment 1, positions of potential gradients in each cross-sectional surface of the line A1-A2, the line B1-B2, and the line C1-C2 are close to each other compared to those in FIG. 19. This indicates that a change in positions of equipotential lines is small from the position of the line A1-A2 toward the position of the line B1-B2 via the position of the line C1-C2. That is to say, in the semiconductor device 100 of the embodiment 1, all of the p-type pillar regions 2 extend in the same direction, however, the plurality of withstand voltage holding structures 3 are disposed in the termination region, thus the local electrical field concentration is reduced at the corner portion of the chip. Thus, the semiconductor device 100 having the high withstand voltage can be obtained.

As illustrated in FIG. 4 and FIG. 5, the change in the potential gradients can be reduced in each cross-sectional surface corresponding to the line A1-A2, the line B1-B2, and the line C1-C2 illustrated in FIG. 20 also in a case where the p-type pillar region 2 located on the outer side of the outermost periphery of the withstand voltage holding structure 3, however, the electrical field concentration can be further reduced on the outer side of the outermost periphery of the withstand voltage holding structure 3 by providing one or more p-type pillar regions 2 on the outer side of the outermost periphery of the withstand voltage holding structure 3.

In the configuration illustrated in FIG. 6, the p-type pillar regions 2 and the withstand voltage holding structure 3 are formed at an identical pitch, and a depletion hardly proceeds in a region where the withstand voltage holding structure 3 and the p-type pillar regions 2 have an overlap with each other in the reverse bias state. In this case, the position where the potential gradient occurs can be limited to the portion between the withstand voltage holding structures 3 more easily in each cross-sectional surface corresponding to the line A1-A2, the line B1-B2, and the line C1-C2 illustrated in FIG. 20. Thus, the positions of the potential gradients in the cross-sectional surfaces in the termination region in each direction are closer to each other, and the local electrical field concentration at the corner portion can be further reduced. Since the part of the withstand voltage holding structure 3 projects from the sidewall of the p-type pillar regions 2, the electrical field concentration at the end portion of the region where the depletion does not occur inside the withstand voltage holding structure 3 can be further reduced.

As illustrated in FIG. 7, in the case where the p-type pillar region 2 is disconnected in the region where the withstand voltage holding structure 3 is not formed, generated is a similar structure that the portion between the withstand voltage holding structures 3 is made up of only the drift layer 1 in any cross-sectional surface corresponding to the line A1-A2, the line B1-B2, and the line C1-C2 illustrated in FIG. 20. Thus, the positions of the potential gradients in the cross-sectional surfaces in the termination region in each direction are further close to each other. Accordingly, the local electrical field concentration at the corner portion can be further reduced. If the local p-type pillar region 2a is provided as illustrated in FIG. 8, the effect can be further increased.

As illustrated in FIG. 9 and FIG. 10, even if the bottoms of the p-type pillar regions 2 do not reach the bottoms of the drift layer 1, the depletion layer expands from the PN junction between the drift layer 1 and the p-type pillar region 2, thus the high withstand voltage can be obtained while keeping the impurity concentration of the drift layer 1 high in the manner similar to the structure in FIG. 1.

As illustrated in FIG. 11, in the case where the high concentration p region 7 having the impurity concentration higher than that of the withstand voltage holding structure 3 is provided in the position in the surface layer of the withstand voltage holding structure 3 including the portion which has an overlap with the surface electrode 5, a total number of response carriers in the high concentration p region 7 is sufficiently maintained even if the reverse bias is precipitously applied to the semiconductor device, and the electrical field concentration at the end portion of the surface electrode 5 can be reduced.

If the field insulating film 8 is formed on the drift layer 1 including the p-type pillar region 2 to cover the withstand voltage holding structure 3 as illustrated in FIG. 12, a fixed charge amount introduced into the surface of the drift layer 1 can be reduced compared to the case where the field insulating film 8 is not formed, thus the high withstand voltage semiconductor device can be obtained without preventing the function of the p-type pillar region 2 and the withstand voltage holding structure 3.

<Embodiment 2>

The embodiment 2 describes the example that the present invention is applied to a metal oxide semiconductor field effect transistor (MOSFET). However, the present invention can also be applied to a junction FET (JFET) and an insulated gate bipolar transistor (IGBT) as well as the MOSFET.

Figure 22:
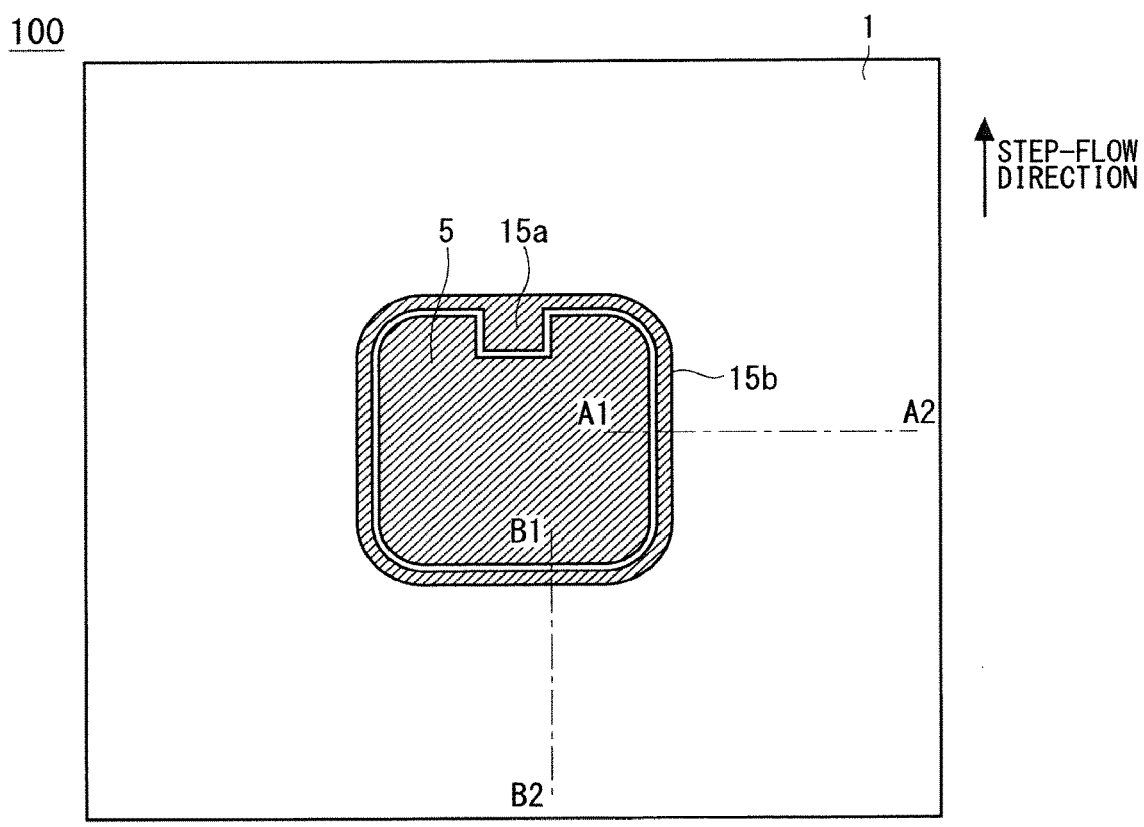
FIG. 22 A schematic plan view of a MOSFET according to an embodiment 2.
Figure 23:
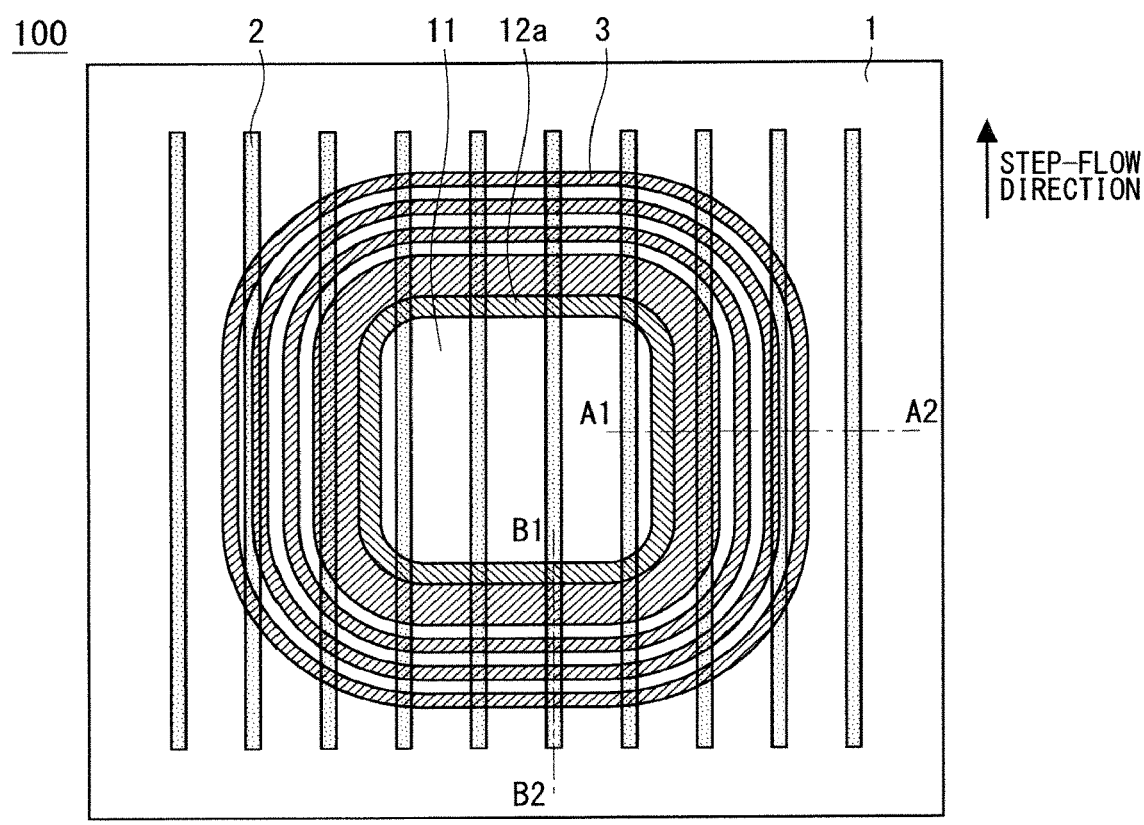
FIG. 23 A schematic plan view of a drift layer of the MOSFET according to the embodiment 2.
Figure 24:
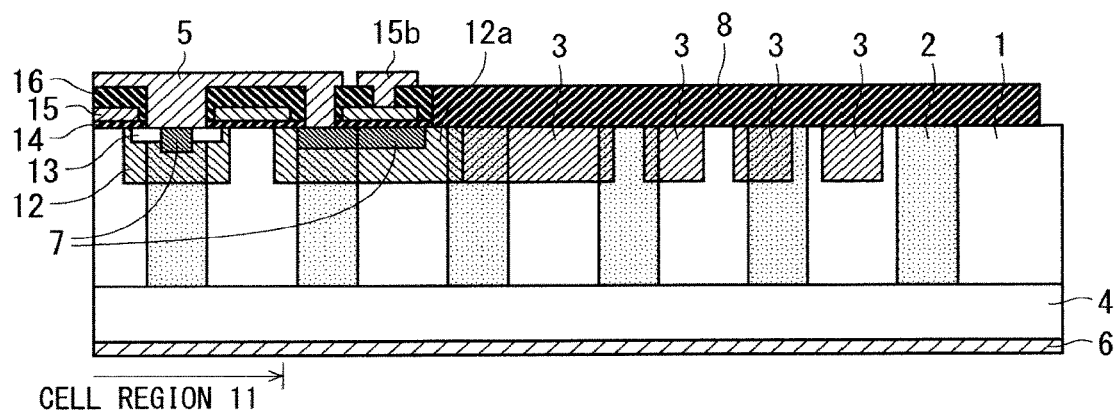
FIG. 24 A schematic cross-sectional view of the MOSFET according to the embodiment 2.
Figure 25:
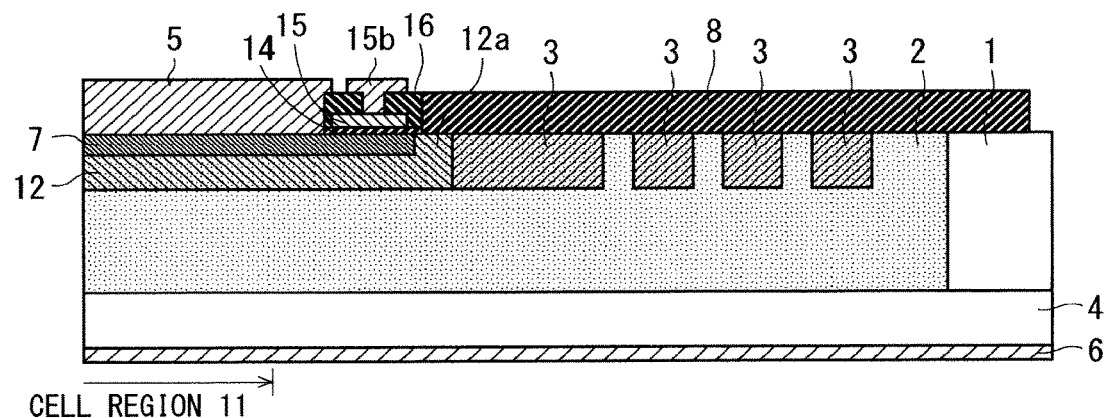
FIG. 25 A schematic cross-sectional view of the MOSFET according to the embodiment 2.
Figure 26:
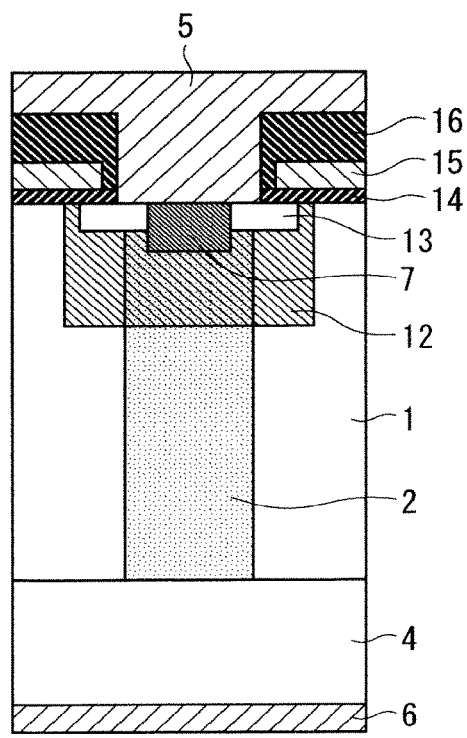
FIG. 26 A schematic cross-sectional view of a unit cell of the MOSFET according to the embodiment 2.

FIG. 22 to FIG. 26 are schematic drawings illustrating a configuration of the MOSFET which is a semiconductor device 200 according to the embodiment 2. FIG. 22 is a plan view of the semiconductor device 200, and FIG. 23 is a plan view illustrating a surface structure of the drift layer 1 thereof. FIG. 24 is a cross-sectional view along A1-A2 in FIG. 22 and FIG. 23, and FIG. 25 is a cross-sectional view along B1-B2 in FIG. 22 and FIG. 23. FIG. 26 is a cross-sectional view illustrating a configuration of a unit cell of the MOSFET (referred to as a "MOSFET cell" hereinafter), a plurality of MOSFET cells being provided in the semiconductor device 200. The MOSFET cell is also shown in a left end of FIG. 24.

As illustrated in FIG. 22, the surface electrode 5 functioning as a source pad of the MOSFET, a gate pad 15a formed separately from the surface electrode 5, and a gate wiring 15b connected to the gate pad 15a and formed to surround the surface electrode 5 are formed on an upper surface of the semiconductor device 200.

As illustrated in FIG. 23, the drift layer 1 of the semiconductor device 200 has the super junction structure in which the plurality of linear p-type pillar regions 2 extending in the direction of the off-angle of the semiconductor substrate 4 (the step-flow direction) are formed in the manner similar to that of the embodiment 1, and the plurality of withstand voltage holding structures 3 are formed in the termination region to surround the active region. Each withstand voltage holding structure 3 has a frame-like shape including sides extending in parallel with the p-type pillar region 2 and sides perpendicular to the p-type pillar region 2 in a planar view.

The active region in the semiconductor device 200 is a cell region 11 in which the plurality of unit cells of the MOSFETs are formed. A p-type peripheral well region 12a is formed on an outer periphery of the cell region 11 in the surface layer of the drift layer 1 including the p-type pillar region 2 to have a contact with the innermost withstand voltage holding structure 3. The peripheral well region 12a has a frame-like shape surrounding the cell region 11 along the innermost withstand voltage holding structure 3.

The cell region 11 has a configuration that a cross-sectional structure of the MOSFET cell illustrated in FIG. 26 extends in the step-flow direction and a cross-sectional structure of the MOSFET cell illustrated in FIG. 26 is repeated in a direction normal to the step-flow direction.

As illustrated in FIG. 26, the MOSFET cell has a p-type well region 12 formed in the surface layer of the drift layer 1 including the p-type pillar region 2. The p-type well region 12 has a width wider than that of the p-type pillar region 2 to reach the drift layer 1 on both sides of the p-type pillar region 2.

An n-type source region 13 is formed in the surface layer of the p-type well region 12. A portion in the surface layer of the p-type well region 12 sandwiched between the n-type source region 13 and the drift layer 1 is a channel region of the MOSFET. The high concentration p region 7 is further formed in the surface layer of the p-type well region 12, and the n-type source region 13 is formed to sandwich the high concentration p region 7 so that the channel region is formed on the both sides of the p-type well region 12.

A gate insulating film 14 is formed to extend across the surfaces of drift layer 1, p-type well region 12, and n-type source region 13, and a gate electrode 15 is formed thereon. That is to say, the gate electrode 15 extends on the channel region via the gate insulating film 14.

An interlayer insulating film 16 is formed on the gate electrode 15. The surface electrode 5 illustrated in FIG. 22 is formed on the interlayer insulating film 16, and the surface electrode 5 and the gate electrode 15 are insulated from each other by the interlayer insulating film 16. A contact hole reaching the n-type source region 13 and the high concentration p region 7 is formed in the interlayer insulating film 16, and the surface electrode 5 is connected to the n-type source region 13 and the high concentration p region 7 through the contact hole (the surface electrode 5 and the high concentration p region 7 have an ohmic connection to each other). As described above, the surface electrode 5 is connected to the n-type source region 13, thereby functioning as a source electrode of the MOSFET, and is electrically connected to the p-type well region 12 through the high concentration p region 7. The back surface electrode 6 provided on the lower surface of the semiconductor substrate 4 functions as a drain electrode of the MOSFET.

As illustrated in FIG. 24 and FIG. 25, the high concentration p region 7 is also formed in a surface layer of the peripheral well region 12a, and the surface electrode 5 is also connected to the high concentration p region 7 of the peripheral well region 12a through the contact hole formed in the interlayer insulating film 16. That is to say, the surface electrode 5 is also electrically connected to the peripheral well region 12a through the high concentration p region 7.

The gate insulating film 14 and the gate electrode 15 extends onto the peripheral well region 12a, and further includes a frame-like pattern surrounding the cell region 11 together with the peripheral well region 12a. That is to say, the gate electrodes 15 of each MOSFET cell are connected to each other in the outer periphery of the cell region 11. The gate wiring 15b illustrated in FIG. 22 is connected to the gate electrode 15 through the contact hole formed in the interlayer insulating film 16 in the outer periphery of the cell region 11.

The gate electrodes 15 of each MOSFET cell may be connected to each other on an inner side of the cell region 11. Also applicable in such a case is a configuration that the gate wiring 15b extends above the cell region 11 and the gate wiring 15b and the gate electrode 15 are connected to each other on the inner side of the cell region 11.

The field insulating film 8 is formed on the drift layer 1 including the p-type pillar region 2 in the termination region of the semiconductor device 200 to cover the withstand voltage holding structure 3. The gate electrode 15 and the interlayer insulating film 16 may extends onto the field insulating film 8.

The configuration and the layout of the p-type pillar region 2 and the withstand voltage holding structure 3 described in the embodiment 1 using FIG. 4 to FIG. 10 is also applicable to the semiconductor device 200 of the embodiment 2.

Next, a method of manufacturing the semiconductor device 200 according to the embodiment 2 is described.

Firstly, the n-type drift layer 1 is formed on the surface of the semiconductor substrate 4 made up of an n-type SiC having the off-angle by a method similar to that of the embodiment 1, and the plurality of pillar regions 2 extending in the step-flow direction are formed to be embedded in the drift layer 1. In the manner similar to the embodiment 1, a thickness of the drift layer 1 is within a range of 2 μm to 150 μm, a width of the p-type pillar region 2 is within a range of 1 μm to 5 μm, an interval between the p-type pillar regions 2 is within a range of 1 μm to 15 μm, and an impurity concentration of the drift layer 1 and the p-type pillar region 2 is within a range of $1\times10^{15}$ cm$^{-3}$ to $1\times10^{17}$ cm$^{-3}$.

In the present embodiment, the p-type well region 12 of the MOSFET cell is provided at the same repeating pitch as that of the p-type pillar region 2, thus the width of the p-type pillar region 2 is preferably smaller than the interval between the p-type pillar regions 2 so that the MOSFET cell is disposed with high density. In such a case, the impurity concentration of the p-type pillar region 2 is preferably higher than that of the drift layer 1 so that the depletion layer expands to the drift layer 1 and the p-type pillar region 2.

Subsequently, the mask formation using the photolithography technique and the ion implantation are repeated to form the withstand voltage holding structure 3, the p-type well region 12, the peripheral well region 12a, the high concentration p region 7, and the n-type source region 13 are formed on the surface of the drift layer 1. The p-type well region 12 and the peripheral well region 12a may be formed at the same time by the same ion implantation process. N, for example, can be adopted as an ion species for forming the n-type semiconductor region. Al or B, for example, can be adopted as an ion species for forming the p-type semiconductor region.

The impurity concentration of the withstand voltage holding structure 3 is higher than that of the drift layer 1, and is set to be equal to or smaller than $1.0\times10^{18}$ cm$^{-3}$. The impurity concentrations of the p-type well region 12 and the peripheral well region 12a are higher than the impurity concentration of the withstand voltage holding structure 3, and is set to be equal to or smaller than $1.0\times10^{20}$ cm$^{-3}$. The impurity concentrations of the high concentration p region 7 and the n-type source region 13 are higher than those of the p-type well region 12 and the peripheral well region 12a.

Subsequently, annealing is performed for thirty seconds to one hour in an inactive gas atmosphere (1300° C. to 1900° C.) such as an argon (Ar) gas using a thermal treatment device. The ions implanted in the process described above are electrically activated by the annealing.

Then, the silicon oxide film is formed on the surface of the drift layer 1 including the p-type pillar region 2 by the CVD method, for example, and the silicon oxide film is patterned by the selective etching using the photolithography technique to form the field insulating film 8.

Subsequently, the surfaces of the drift layer 1 and the p-type pillar region 2 which are not covered by the field insulating film 8 are thermally oxidized to form the gate insulating film 14 made up of the silicon oxide film. Next, a polycrystal silicon film having conductivity is formed on the gate insulating film 14 by a decompression CVD method and patterned to form the gate electrode 15.

Furthermore, the interlayer insulating film 16 is formed by the decompression CVD method. Then, the interlayer insulating film 16 is selected etched to form the various types of contact holes. Specifically, the contact hole reaching the n-type source region 13 and the high concentration p region 7 of the MOSFET cell is formed in the cell region 11, and the contact hole reaching the high concentration p region 7 of the p-type well region 12 and the contact hole reaching the gate electrode 15 are formed in the outer periphery of the cell region 11.

Then, the surface electrode 5, the gate pad 15a, and the gate wiring 15b are formed on the upper surface of the drift layer 1 and furthermore, the back surface electrode 6 is formed on the lower surface of the semiconductor substrate 4 by the sputtering method or the evaporation method, for example. As a result, the semiconductor device 200 having the configuration illustrated in FIG. 24 and FIG. 25 is completed.

One or a plurality of metals such as Ni, Ti, and Al can be adopted as the material of the surface electrode 5, and one or a plurality of metals such as Ni and Au, for example, can be adopted as the material of the back surface electrode 6. The surface electrode 5 and the back surface electrode 6 are reacted with the silicon carbide layer having a contact with the surface electrode 5 and the back surface electrode 6 by the thermal treatment, thereby forming a silicide between the surface electrode 5 and the silicon carbide layer and between the back surface electrode 6 and the silicon carbide layer.

An operation of the semiconductor device 200 is described next. Separately described herein are an operation of an "ON state" where a positive voltage equal to or larger than a threshold value is applied to the gate electrode 15 and an operation of an "OFF state" where a voltage of the gate electrode 15 is smaller than the threshold value.

In the ON state, an inversion channel is formed in the channel region, and a pathway through which electrons, which are carriers, flow is formed between the n-type source region 13 and the drift layer 1. Thus, when the voltage higher than that of the surface electrode 5 is applied to the back surface electrode 6, the current flows through the drift layer 1. At this time, the current flowing between the surface electrode 5 and the back surface electrode 6 is called an "ON current", the voltage applied between the surface electrode 5 and the back surface electrode 6 is called an "ON voltage", and a value obtained by dividing the ON voltage by a density of the ON current is called an "ON resistance". The ON resistance is equal to a sum of resistance in a pathway through which the electrons described above flow. A conduction loss caused by a conduction loss when the current is applied to the MOSFET equals a product of the ON resistance and a square of the ON current, thus the ON resistance is preferably small. The ON current only flows in the cell region 11 which includes the channel, and does not flow in the termination region on the periphery of the cell region 11.

In the semiconductor device 200 having the super junction structure, the drift layer 1 having the extremely high impurity concentration has the small electrical resistance, thus the ON resistance is extremely small compared to a semiconductor device which does not have the super junction structure, and a power consumption can be extremely reduced.

In the meanwhile, in the OFF state, the inversion carrier is not formed in the channel region and the ON current does not flow, thus the high voltage is applied between the surface electrode 5 and the back surface electrode 6 in the MOSFET. At this time, the voltage of the gate electrode 15 is substantially equal to the voltage of the surface electrode 5, thus the high voltage is also applied between the gate electrode 15 and the back surface electrode 6.

In the semiconductor device 200 having the super junction structure, the depletion layer also extends in the lateral direction from the PN junction between the drift layer 1 and the p-type pillar region 2 in the cell region 11, thus the sufficient withstand voltage can be ensured even if the impurity concentration of the drift layer 1 is extremely high. Furthermore, a reduction in the withstand voltage is small even if the interval between the MOSFET cells is increased, thus the resistance can be reduced by increasing the pathway of the electrons.

In the present embodiment, the peripheral well region 12a provided on the outer periphery of the cell region 11 is electrically connected to the surface electrode 5. Thus, in the OFF state of the semiconductor device 200, prevented is the high electrical field applied to the gate insulating film 14 between the peripheral well region 12a and the gate electrode 15 thereon and the field insulating film 8.

In the OFF state of the semiconductor device 200, the withstand voltage holding structure 3 functions in a manner similar to the case of the reverse bias state in the semiconductor device 100 of the embodiment 1. That is to say, as described using FIG. 21, the positions of the potential gradients in the cross section of the termination region in each direction can be close to each other, and the local electrical field concentration in the corner portion of the chip can be reduced. The withstand voltage of the semiconductor device 200 is thereby improved.

The effect similar to that of the embodiment 1 can also be obtained in the case where the configuration and the layout of the p-type pillar region 2 and the withstand voltage holding structure 3 described using FIG. 4 to FIG. 10 are applied to the semiconductor device 200 of the embodiment 2.

Although the material of the semiconductor substrate 4 is SiC in the embodiments described above, the present invention can be widely applied to the semiconductor device formed using the semiconductor substrate having the off-angle other than SiC.

According to the present invention, the above embodiments can be arbitrarily combined, or each embodiment can be appropriately varied or omitted within the scope of the invention.

EXPLANATION OF REFERENCE SIGNS 1 drift layer, 2 p-type pillar region, 2a local p-type pillar region, 3 withstand voltage holding structure, 4 semiconductor substrate, 5 surface electrode, 6 back surface electrode, 7 high concentration p region, 8 field insulating film, 9 trench, 10 photoresist, 11 cell region, 12 p-type well region, 12a peripheral well region, 13 n-type source region, 14 gate insulating film, 15 gate electrode, 15a gate pad, 15b gate wiring, 16 interlayer insulating film, 20 p-type semiconductor, 100, 200 semiconductor device.

The invention claimed is:

1. A semiconductor device, comprising:
   a semiconductor substrate;
   a drift layer of a first conductivity type formed on the semiconductor substrate;
   a plurality of pillar regions of a second conductivity type formed in the drift layer;
   a surface electrode formed on the drift layer including the plurality of pillar regions; and
   a plurality of withstand voltage holding structures of a second conductivity type formed in a surface layer of the drift layer including the plurality of pillar regions to surround an active region, wherein
   each of the plurality of pillar regions has a linear shape extending in parallel with each other and provided to have a striped shape extending in parallel with a direction of an off-angle of the semiconductor substrate,
   each of the plurality of withstand voltage holding structures has a frame-like shape including sides extending in parallel with the plurality of pillar regions and sides perpendicular to the plurality of pillar regions in a planar view, and
   in at least two of the plurality of withstand voltage holding structures adjacent to each other, sides extending in parallel with the plurality of pillar regions are formed at an identical pitch with the plurality of pillar regions and to have an overlap with the plurality of pillar regions.

2. The semiconductor device according to claim 1, wherein
   the semiconductor substrate has an off-angle, and
   each of the plurality of pillar regions has a linear shape extending in a direction of the off-angle.

3. The semiconductor device according to claim 2, wherein
   at least one of the plurality of pillar regions is formed on an outer side of an outermost periphery of the plurality of withstand voltage holding structures in a direction normal to a direction of the off-angle.

4. The semiconductor device according to claim 1, wherein
   at least one of the plurality of pillar regions extends to an outer side of an outermost periphery of the plurality of withstand voltage holding structures.

5. The semiconductor device according to claim 1, wherein
   the semiconductor substrate is formed of silicon carbide.

6. A semiconductor device, comprising:
   a semiconductor substrate;
   a drift layer of a first conductivity type formed on the semiconductor substrate;
   a plurality of pillar regions of a second conductivity type formed in the drift layer;
   a surface electrode formed on the drift layer including the plurality of pillar regions; and
   a plurality of withstand voltage holding structures of a second conductivity type formed in a surface layer of the drift layer including the plurality of pillar regions to surround an active region, wherein
   each of the plurality of pillar regions has a linear shape extending in parallel with each other and provided to have a striped shape extending in parallel with a direction of an off-angle of the semiconductor substrate,
   each of the plurality of withstand voltage holding structures has a frame-like shape including sides extending in parallel with the plurality of pillar regions and sides perpendicular to the plurality of pillar regions in a planar view,
   in at least two of the plurality of withstand voltage holding structures adjacent to each other, sides extending in parallel with the plurality of pillar regions are formed at an identical pitch with the plurality of pillar regions, and
   at least one of the plurality of withstand voltage holding structures which are formed at the identical pitch with the plurality of pillar regions is formed to project outside the plurality of pillar regions.

7. The semiconductor device according to claim 6, wherein
   the semiconductor substrate has an off-angle, and
   each of the plurality of pillar regions has a linear shape extending in a direction of the off-angle.

8. The semiconductor device according to claim 7, wherein
at least one of the plurality of pillar regions is formed on an outer side of an outermost periphery of the plurality of withstand voltage holding structures in a direction normal to a direction of the off-angle.

9. The semiconductor device according to claim 6, wherein
at least one of the plurality of pillar regions extends to an outer side of an outermost periphery of the plurality of withstand voltage holding structures.

10. The semiconductor device according to claim 6, wherein
the semiconductor substrate is formed of silicon carbide.

11. A semiconductor device, comprising:
a semiconductor substrate;
a drift layer of a first conductivity type formed on the semiconductor substrate;
a plurality of pillar regions of a second conductivity type formed in the drift layer;
a surface electrode formed on the drift layer including the plurality of pillar regions; and
a plurality of withstand voltage holding structures of a second conductivity type formed in a surface layer of the drift layer including the plurality of pillar regions to surround an active region, wherein
each of the plurality of pillar regions has a linear shape extending in parallel with each other and provided to have a striped shape extending in parallel with a direction of an off-angle of the semiconductor substrate,
each of the plurality of withstand voltage holding structures has a frame-like shape including sides extending in parallel with the plurality of pillar regions and sides perpendicular to the plurality of pillar regions in a planar view, and
at least one of the plurality of pillar regions has an intermissive linear shape with a disconnection in a region where the plurality of withstand voltage holding structures are not formed.

12. The semiconductor device according to claim 11, further comprising
a local pillar region being formed in a position having an overlap with any of the plurality of withstand voltage holding structures in a planar view in a portion where an interval between the plurality of pillar regions increases due to a disconnection of the plurality of pillar regions having a linear shape.

13. The semiconductor device according to claim 11, wherein
the semiconductor substrate has an off-angle, and
each of the plurality of pillar regions has a linear shape extending in a direction of the off-angle.

14. The semiconductor device according to claim 13, wherein
at least one of the plurality of pillar regions is formed on an outer side of an outermost periphery of the plurality of withstand voltage holding structures in a direction normal to a direction of the off-angle.

15. The semiconductor device according to claim 11, wherein
at least one of the plurality of pillar regions extends to an outer side of an outermost periphery of the plurality of withstand voltage holding structures.

16. The semiconductor device according to claim 11, wherein
the semiconductor substrate is formed of silicon carbide.

* * * * *